(12) United States Patent
Nakabayashi et al.

(10) Patent No.: US 12,707,693 B2
(45) Date of Patent: Aug. 11, 2026

(54) SEMICONDUCTOR DEVICE AND METHOD FOR MANUFACTURING SEMICONDUCTOR DEVICE

(71) Applicant: KABUSHIKI KAISHA TOSHIBA, Tokyo (JP)

(72) Inventors: Yukio Nakabayashi, Yokohama (JP); Tatsuo Shimizu, Tokyo (JP); Toshihide Ito, Tokyo (JP); Chiharu Ota, Kawasaki (JP); Johji Nishio, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 616 days.

(21) Appl. No.: 18/170,156

(22) Filed: Feb. 16, 2023

(65) Prior Publication Data

US 2024/0072119 A1 Feb. 29, 2024

(30) Foreign Application Priority Data

Aug. 30, 2022 (JP) ................................ 2022-136433

(51) Int. Cl.
*H10D 62/832* (2025.01)
*H10D 12/01* (2025.01)
(Continued)

(52) U.S. Cl.
CPC ....... *H10D 62/8325* (2025.01); *H10D 12/031* (2025.01); *H10D 30/66* (2025.01); *H10D 62/405* (2025.01)

(58) Field of Classification Search
CPC .. H10D 62/8325; H10D 12/031; H10D 30/66; H10D 62/405; H10D 30/0291; H10D 64/685; H10D 64/693
(Continued)

(56) References Cited

U.S. PATENT DOCUMENTS 6,482,857 B1 * 11/2002 Bradbury ................ A61K 8/63 514/880
9,209,262 B2 12/2015 Tanaka et al.
(Continued)

FOREIGN PATENT DOCUMENTS

JP 2006156478 A 6/2006
JP 2017216306 A 12/2017
(Continued)

OTHER PUBLICATIONS

Office Action issued on Apr. 18, 2025, in corresponding Japanese Application No. 2022-136433, 19 pages.
(Continued)

*Primary Examiner* — Sheikh Maruf
(74) *Attorney, Agent, or Firm* — Maier & Maier, PLLC

(57) ABSTRACT

According to one embodiment, a semiconductor device includes a silicon carbide member, a first member, a first layer, and a second layer. The silicon carbide member includes a first region. The first member includes silicon and oxygen. The first layer is provided between the first region and the first member. The first layer includes a bond between silicon and nitrogen. The second layer is provided between the first layer and the first member. The second layer includes a bond between silicon and oxygen and a bond between silicon and nitrogen.

14 Claims, 4 Drawing Sheets

(51) Int. Cl.
*H10D 30/66* (2025.01)
*H10D 62/40* (2025.01)

(58) Field of Classification Search
USPC ........................................................ 257/77
See application file for complete search history.

(56) References Cited

U.S. PATENT DOCUMENTS

| | | | | |
|---|---|---|---|---|
| 2007/0090465 | A1* | 4/2007 | Suzuki | H10D 84/0184 257/369 |
| 2011/0017998 | A1* | 1/2011 | Nakano | H10D 64/513 257/77 |
| 2012/0214309 | A1* | 8/2012 | Itoh | H10D 30/0291 156/345.31 |
| 2013/0082282 | A1* | 4/2013 | Suzuki | H10D 30/668 257/77 |
| 2013/0240906 | A1* | 9/2013 | Shimizu | H10D 12/441 257/77 |
| 2015/0303271 | A1* | 10/2015 | Tanaka | H01L 21/049 257/77 |
| 2016/0133705 | A1* | 5/2016 | Horii | H01L 21/0445 438/694 |
| 2016/0181160 | A1* | 6/2016 | Yuki | H01L 21/28202 438/590 |
| 2016/0190234 | A1* | 6/2016 | Iijima | H10D 30/66 257/77 |
| 2017/0033185 | A1* | 2/2017 | Shimizu | H10D 62/106 |
| 2017/0077238 | A1* | 3/2017 | Kono | H10D 62/8325 |
| 2017/0077285 | A1* | 3/2017 | Uehara | H10D 62/8325 |
| 2017/0084735 | A1* | 3/2017 | Takeuchi | H10D 62/8171 |
| 2017/0345903 | A1* | 11/2017 | Shimizu | H01L 21/049 |
| 2018/0033876 | A1* | 2/2018 | Sugahara | H10D 12/481 |
| 2018/0301536 | A1* | 10/2018 | Utsumi | H10D 30/668 |
| 2018/0350900 | A1* | 12/2018 | Nakamata | H10D 12/031 |
| 2019/0131398 | A1* | 5/2019 | Kyogoku | H10D 62/60 |
| 2019/0273134 | A1* | 9/2019 | Ota | H01L 21/02378 |
| 2019/0362975 | A1* | 11/2019 | Mukai | H10D 62/60 |
| 2021/0035882 | A1* | 2/2021 | Schaetz | H10D 62/8325 |
| 2021/0036116 | A1* | 2/2021 | Kyogoku | H10D 62/107 |
| 2021/0265469 | A1* | 8/2021 | Horii | H10D 30/668 |
| 2021/0296128 | A1* | 9/2021 | Shimizu | H10D 30/66 |
| 2022/0005925 | A1 | 1/2022 | Shimizu et al. | |
| 2022/0069089 | A1* | 3/2022 | Kawada | H01L 21/049 |

FOREIGN PATENT DOCUMENTS

| | | | |
|---|---|---|---|
| JP | 2019121676 | A | 7/2019 |
| JP | 2020150173 | A | 9/2020 |
| JP | 2021022706 | A | 2/2021 |
| JP | 2021153168 | A | 9/2021 |
| JP | 202212282 | A | 1/2022 |
| JP | 202241725 | A | 3/2022 |
| WO | 2011158528 | A1 | 12/2011 |
| WO | 2014103186 | A1 | 7/2014 |

OTHER PUBLICATIONS

Office Action issued on Sep. 10, 2025, in corresponding Japanese Application No. 2022-136433, 12 pages.

Shirasawa et al., "Epitaxial Silicon Oxynitride Layer on a 6H—SiC(0001) Surface", Physical Review Letters, 98, 136105, Mar. 30, 2007, 4 pages.

* cited by examiner

T1

12f

11

30

D1

T1

12f
11
30
D1

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2022-136433, filed on Aug. 30, 2022; the entire contents of which are incorporated herein by reference.

FIELD

Embodiments described herein relate generally to a semiconductor device and a method for manufacturing semiconductor device.

BACKGROUND

There are semiconductor devices such as transistors using silicon carbide (SiC). Good characteristics are required in semiconductor devices.

DETAILED DESCRIPTION

Figure 1:
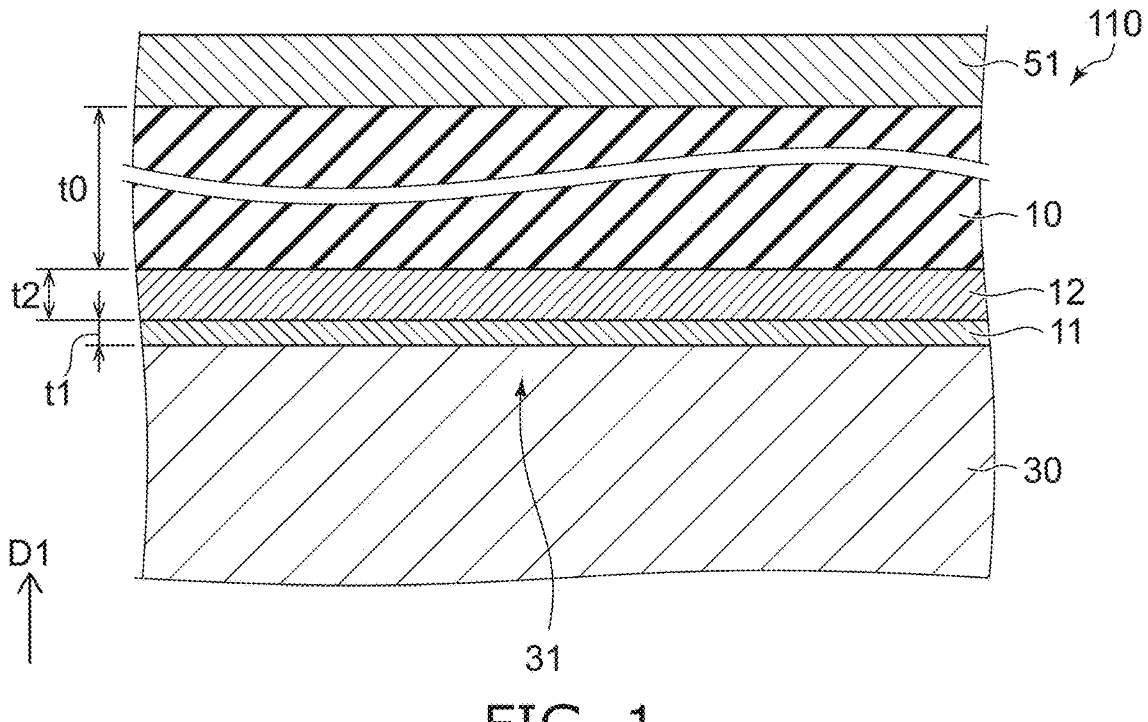
FIG. 1 is a schematic cross-sectional view illustrating a semiconductor device according to a first embodiment.

According to one embodiment, a semiconductor device includes a silicon carbide member, a first member, a first layer, and a second layer. The silicon carbide member includes a first region. The first member includes silicon and oxygen. The first layer is provided between the first region and the first member. The first layer includes a bond between silicon and nitrogen. The second layer is provided between the first layer and the first member. The second layer includes a bond between silicon and oxygen and a bond between silicon and nitrogen.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to the first embodiment.

As shown in FIG. 1, the semiconductor device 110 according to the embodiment includes a silicon carbide member 30, a first member 10, a first layer 11 and a second layer 12.

The silicon carbide member 30 includes a first region 31. The silicon carbide member 30 may include, for example, 4H—SiC, 6H—SiC, or 3C—SiC.

The first member 10 includes silicon and oxygen. The first member 10 includes, for example, $SiO_2$. The first layer 11 is provided between the first region 31 and the first member 10. As will be described later, the first layer 11 includes a bond between silicon and nitrogen. The first layer 11 includes SiN. The first layer 11 may further include a bond between silicon and carbon. For example, the first layer 11 may include SiCN.

The second layer 12 is provided between the first layer 11 and the first member 10. As will be described later, the second layer 12 includes a bond between silicon and oxygen and a bond between silicon and nitrogen. The second layer 12 includes, for example, SiON.

As shown in FIG. 1, the semiconductor device 110 may include a first conductive member 51. The first member 10 is provided between the first region 31 and the first conductive member 51. The first conductive member 51 is, for example, a gate electrode. In this case, the first member 10 functions as a gate insulating film.

As shown in FIG. 1, a direction from the first region 31 to the first member 10 is defined as a first direction D1. A thickness of the first layer 11 in the first direction D1 is defined as a first thickness t1. The first thickness t1 is, for example, 0.5 nm or less. The first thickness t1 may be, for example, 0.3 nm or less.

A thickness of the second layer 12 in the first direction D1 is defined as a second thickness t2. The second thickness t2 is, for example, 1 nm or less. The second thickness t2 may be, for example, 0.7 nm or less. For example, the first thickness t1 is ½ or less of the second thickness t2 of the second layer.

A thickness t0 of the first member 10 in the first direction D1 is, for example, not less than 3 nm and not more than 100 nm. When the first member 10 functions as an insulating film, appropriate characteristics can be obtained.

Figure 2:
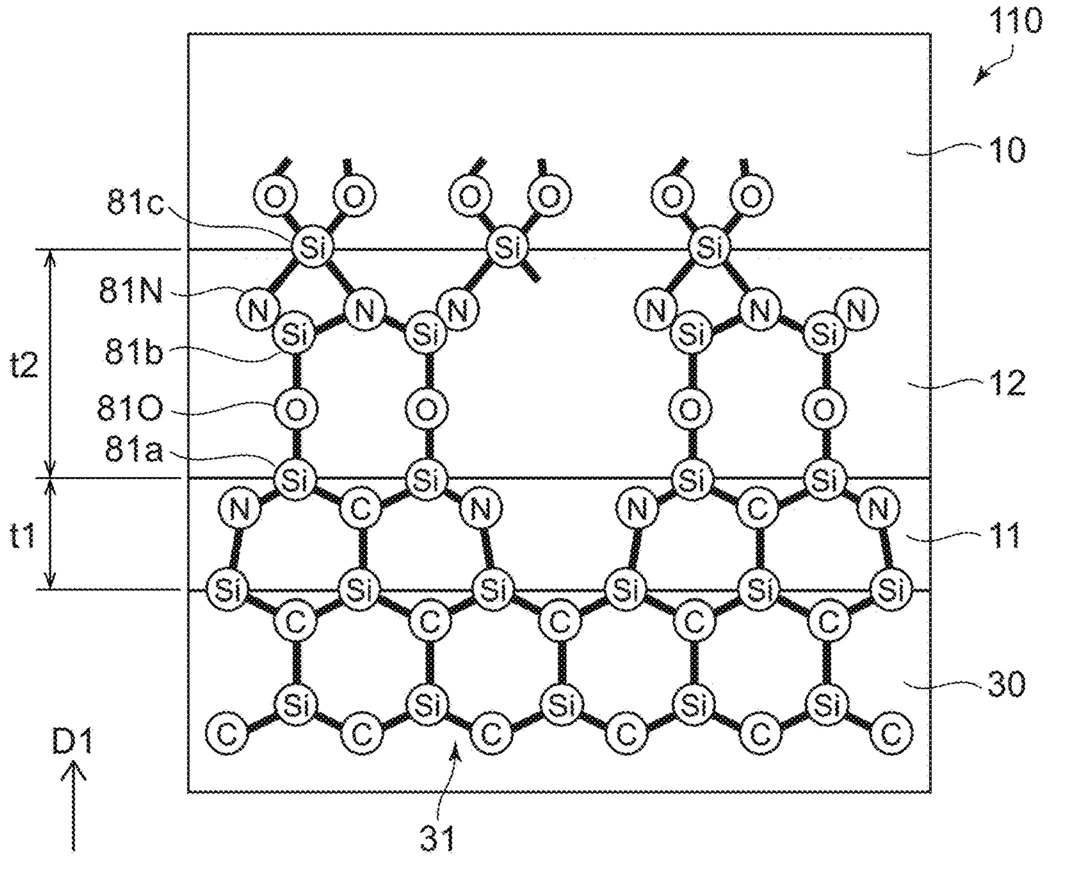
FIG. 2 is a schematic cross-sectional view illustrating the semiconductor device according to the first embodiment.

FIG. 2 is a schematic cross-sectional view illustrating the semiconductor device according to the first embodiment.

As shown in FIG. 2, in one example, the first layer 11 is a layer including a bond between silicon and nitrogen. This layer includes one Si layer and one C layer. One Si layer and one C layer overlap in the first direction D1. The first layer 11 is, for example, a terminal layer. As described above, the first layer 11 may further include a bond between silicon and carbon.

As shown in FIG. 2, the second layer 12 includes a first oxygen 81O, a second silicon 81*b*, and a first nitrogen 81N.

The first oxygen 81O binds to a first silicon 81*a*. The first silicon 81*a* may be included in the first layer 11 or the second layer 12.

The second silicon 81*b* binds to the first oxygen 81O. The first nitrogen 81N binds to the second silicon 81*b* and the third silicon 81*c*. The third silicon 81*c* may be included in the second layer 12 or the first member 10.

An orientation from the first silicon 81*a* to the second silicon 81*b* includes a first orientation component from the first region 31 (silicon carbide member 30) to the first member 10. An orientation from the second silicon 81*b* to the third silicon 81*c* includes the first orientation component. An orientation from the first oxygen 81O to the first nitrogen 81N includes the first orientation component. The second layer 12 is, for example, a transition layer.

By providing such a first layer 11 and a second layer 12, an interface state density can be reduced between the first region 31 and the first member 10.

For example, a termination rate of nitrogen can be improved at the interface between the first region 31 and the first member 10. For example, a good interface is obtained. For example, on the surface of SiC, oxygen is replaced by nitrogen. On the surface, a first bond is generated. A second unbonded hand included in the first member 10 is connected to a first bonded hand. This suppresses the presence of unbonded hands.

For example, in the first region 31, oxidation is suppressed. In the first region 31, the introduction of unnecessary nitrogen is suppressed. In the embodiment, for example, at the interface between the gate insulating film and the semiconductor, the termination rate due to nitrogen of the unbonded hand can be improved. The interface state density is reduced. For example, the reliability of the insulating film is improved.

In the embodiment, the first layer 11 is, for example, a terminal layer including a high concentration of nitrogen. The second layer 12 is, for example, a transition layer including silicon, nitrogen and oxygen. In the embodiment, oxidation in the first region 31 is suppressed. Stable nitrogen termination is obtained. The presence of unbonded hands with the first member 10 is suppressed.

For example, there is a first reference example in which a silicon oxide film is formed on a SiC layer and then heat-treated in an atmosphere including NO or the like. In the first reference example, nitrogen is introduced into the interface between the SiC layer and the silicon oxide film via the silicon oxide film. In this case, avoidable oxidation of the SiC layer occurs. Unwanted nitrogen is introduced into the SiC layer. This makes it difficult to obtain the desired characteristics.

In the embodiment, the oxidation of the first region 31 of SiC, which should be avoided, is suppressed. Introduction of unnecessary nitrogen into the first region 31 of SiC is suppressed. It is easy to obtain the desired characteristics. In the embodiment, the introduction of unnecessary nitrogen into the first member 10 is suppressed. In the first member 10, the trap is suppressed.

In the embodiment, for example, the first region 31 does not include nitrogen. Alternatively, the concentration of nitrogen contained in the first region 31 is less than $1/10^5$ of the concentration of nitrogen included in the first layer 11. In one example, the concentration of nitrogen contained in the first region 31 is $5\times10^{16}$ $cm^{-3}$ or less. The concentration of nitrogen contained in the first region 31 may be $1\times10^{16}$ $cm^{-3}$ or less.

In the embodiment, for example, the first member 10 does not include nitrogen. Alternatively, the concentration of nitrogen included in the first member 10 is less than $1/10^2$ of the concentration of nitrogen included in the first layer 11. In one example, the concentration of nitrogen included in the first member 10 is $5\times10^{19}$ $cm^{-3}$ or less. The concentration of nitrogen included in the first member 10 may be $1\times10^{19}$ $cm^{-3}$ or less. The concentration of nitrogen included in the first member 10 may be $5\times10^{18}$ $cm^{-3}$ or less. The concentration of nitrogen included in the first member 10 may be $1\times10^{18}$ $cm^{-3}$ or less.

Figures 3, 4:
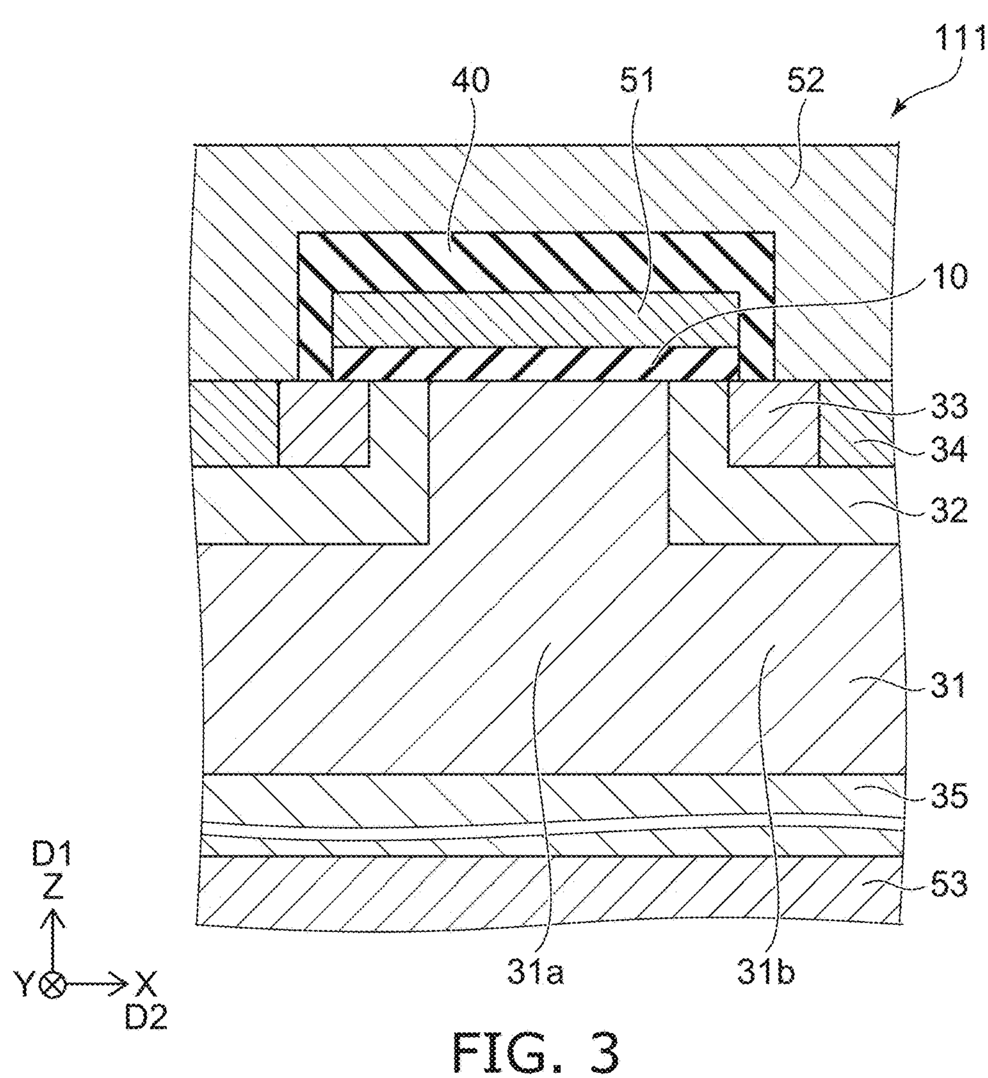
FIG. 3 is a schematic cross-sectional view illustrating a semiconductor device according to the first embodiment.
FIG. 4 is a schematic cross-sectional view illustrating a method for manufacturing the semiconductor device according to a second embodiment.

FIG. 3 is a schematic cross-sectional view illustrating a semiconductor device according to the first embodiment.

As shown in FIG. 3, the semiconductor device 111 according to the embodiment includes a first conductive member 51, a second conductive member 52, and a third conductive member 53. Except for this, the configuration of the semiconductor device 111 may be the same as the configuration of the semiconductor device 110.

As shown in FIG. 3, the first member 10 is provided between the first region 31 and the first conductive member 51. The silicon carbide member 30 further includes a second region 32 and a third region 33. The first region 31 is a first conductive type. The second region 32 is a second conductive type. The third region 33 is the first conductive type. The first conductive type is one of n type and p type. The second conductive type is the other of the n type and the p type. In the following, the first conductive type will be n-type and the second conductive type will be p-type.

The first region 31 and the third region 33 include, for example, N as impurities of the first conductive type. The second region 32 includes Al as a second conductive type impurity. The concentration of the first conductive type impurities in the third region 33 (for example, the carrier concentration) is higher than the concentration of the first conductive type impurities in the first region 31 (for example, the carrier concentration).

At least a part of the second region 32 is between the first region 31 and the third region 33. The second conductive member 52 is electrically connected to the third region 33. The third conductive member 53 is electrically connected to the first region 31.

The current flowing between the third conductive member 53 and the second conductive member 52 can be controlled by a potential of the first conductive member 51. The potential of the first conductive member 51 is, for example, a potential based on the potential of the second conductive member 52. The second conductive member 52 functions as, for example, a source electrode. The third conductive member 53 functions as, for example, a drain electrode. The first conductive member 51 functions as, for example, a gate electrode. The first member 10 functions as, for example, a gate insulating film. The semiconductor device 111 is, for example, a MOS transistor.

A direction from the third conductive member 53 to the first conductive member 51 is along the first direction D1. The first direction D1 is, for example, a Z-axis direction. One direction perpendicular to the Z-axis direction is defined as an X-axis direction. A direction perpendicular to the Z-axis direction and the X-axis direction is defined as a Y-axis direction.

As shown in FIG. 3, the first region 31 includes a first partial region 31*a* and a second partial region 31*b*. In the first direction D1, the first partial region 31*a* is between the third conductive member 53 and the first conductive member. A direction from the first partial region 31*a* to the second partial region 31*b* is along a second direction D2. The second direction D2 is, for example, the X-axis direction. The second partial region 31*b* is located between a part of the third conductive member 53 and a part of the first conductive member 51 in the first direction D1.

In the second direction D2, a part of the second region 32 is between a part of the first region 31 (first partial region 31*a*) and the third region 33. In the first direction D1, another part of the second region 32 is between the second partial region 31*b* and the second conductive member 52.

As shown in FIG. 3, the silicon carbide member 30 may include a fourth region 34. The fourth region 34 is p-shaped. In the second direction D2, there is a part of the second region 32 between a part of the first region 31 (first partial region 31*a*) and the fourth region 34. In the second direction D2, there is the third region 33 between the above-mentioned part of the second region 32 and the fourth region 34.

As shown in FIG. 3, the silicon carbide member 30 may include a fifth region 35. The fifth region 35 is the first conductive type. The fifth region 35 is located between the third conductive member 53 and the first region 31 in the first direction D1. A concentration of the first conductive type impurities in the fifth region 35 (for example, the carrier concentration) is higher than a concentration of the first conductive type impurities in the first region 31 (for example, the carrier concentration). The provision of the fifth region 35 provides low resistance in the electrical connection between the first region 31 and the third conductive member 53.

Second Embodiment

The second embodiment relates to a method for manufacturing the semiconductor device. Hereinafter, an example of the method for manufacturing the above-mentioned semiconductor device 110 will be described.

FIGS. 4 to 7 are schematic cross-sectional views illustrating the method for manufacturing the semiconductor device according to the second embodiment.

As shown in FIG. 4, a first treatment T1 for heat-treating the silicon carbide member 30 is carried out in a first atmosphere. Treatment with high temperature hydrogen may be carried out before the first treatment T1. By the treatment with high temperature hydrogen, the surface of the silicon carbide member is etched and the surface portion including impurities is removed. After this, the first treatment T1 is performed.

The first treatment T1 forms the first layer 11 and a second film 12*f* on the surface portion of the silicon carbide member 30. The first layer 11 includes a bond between silicon and nitrogen. In this example, the first layer 11 further includes a bond between silicon and carbon. The second film 12*f* contains a bond between silicon and oxygen. The first layer 11 is between the silicon carbide member 30 and the second film 12*f*.

The first atmosphere includes nitrogen. The first treatment T1 is, for example, annealing in an atmosphere including nitrogen. The first treatment T1 suppresses the formation of an oxide film on the surface of the silicon carbide member 30, for example. The first atmosphere may include a trace amount of oxygen. An oxygen concentration in the first atmosphere is, for example, 100 ppm or less. When the oxygen concentration is 100 ppm or less, the formation of an oxide film is suppressed.

The first treatment T1 may be performed, for example, in a chamber for epitaxial growth. The temperature of the first treatment T1 is, for example, not lower than 1300° C. and not higher than 1500° C. The time of the first treatment T1 is, for example, not less than 1 minute and not more than 1 hour.

Figure 5:
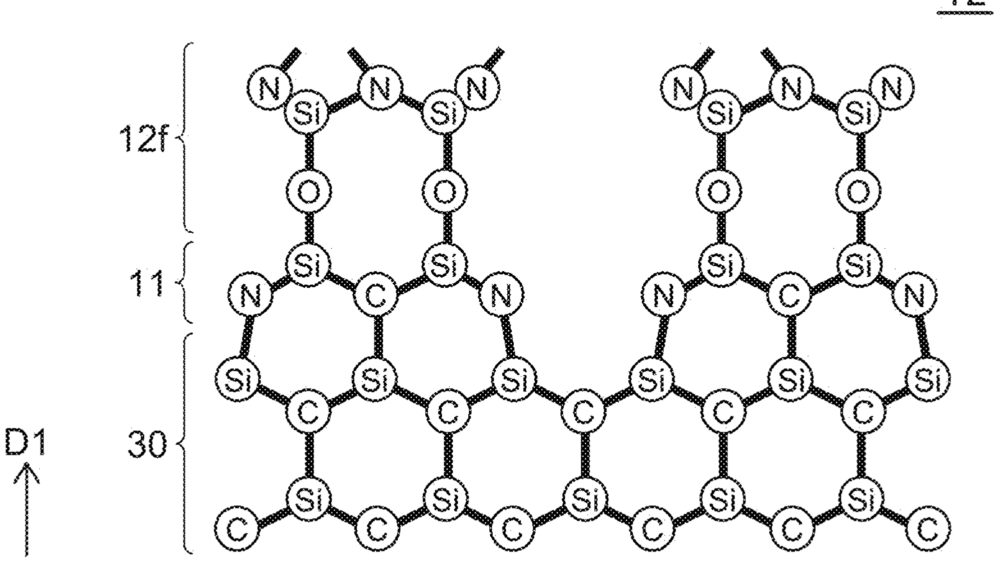
FIG. 5 is a schematic cross-sectional view illustrating a method for manufacturing the semiconductor device according to the second embodiment.

As shown in FIG. 5, a second treatment T2 is performed after the first treatment T1. The second treatment T2 includes heat-treating the silicon carbide member 30 in a second atmosphere including nitrogen and oxygen. For example, the second atmosphere includes at least one selected from the group consisting of NO and $N_2O$. By the second treatment T2, for example, oxygen on the surface of the second film 12*f* is replaced with nitrogen.

The second treatment T2 may be performed by, for example, a heat diffusion chamber. The temperature of the second treatment T2 is, for example, not lower than 1100° C. and not higher than 1300° C. The time of the second treatment T2 is, for example, not less than 1 minute and not more than 1 hour.

Figure 6:
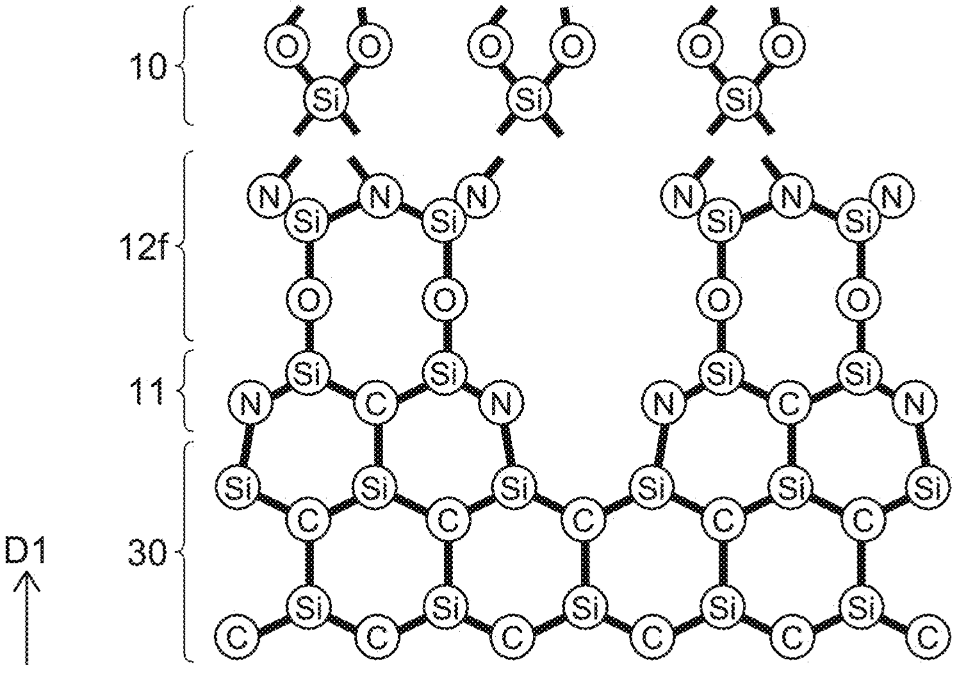
FIG. 6 is a schematic cross-sectional view illustrating a method for manufacturing the semiconductor device according to the second embodiment.

As shown in FIG. 6, the first member 10 is formed on the silicon carbide member 30 (second film 12*f*) after the second treatment T2. The first member 10 includes silicon and oxygen. The first member 10 includes, for example, $SiO_2$. The first member 10 is formed, for example, by Chemical Vapor Deposition (CVD). Chemical Vapor Deposition may include PE-CVD (Plasma Enhanced Chemical Vapor Deposition). Chemical vapor deposition may include Atomic Layer Deposition (ALD).

Figures 7, 8:
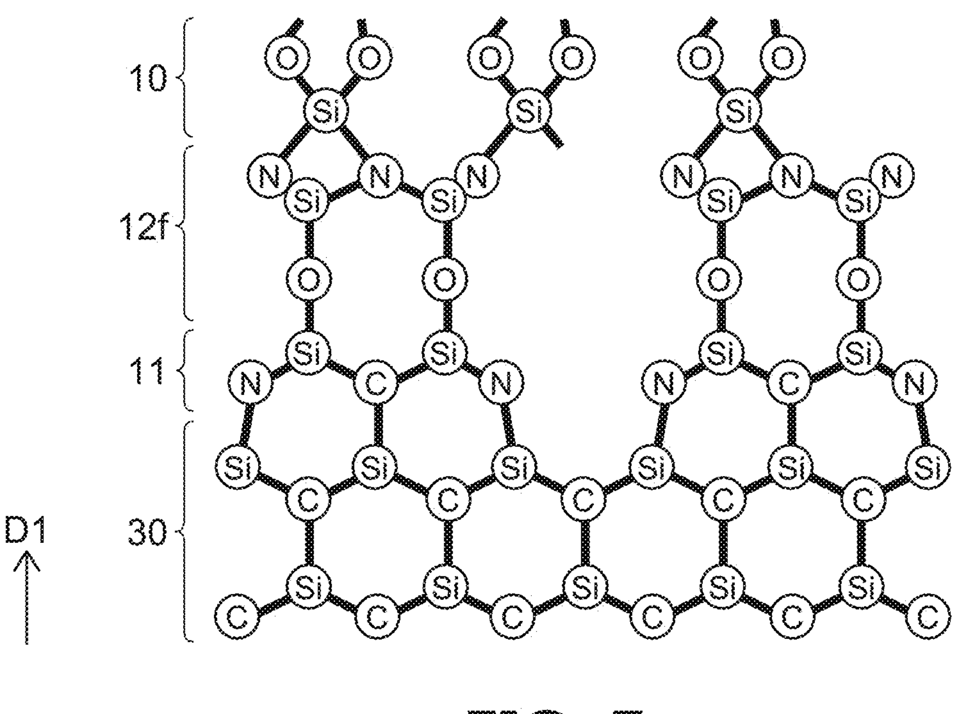
FIG. 7 is a schematic cross-sectional view illustrating a method for manufacturing the semiconductor device according to a second embodiment.
FIG. 8 is a schematic cross-sectional view illustrating the method for manufacturing a semiconductor device according to the second embodiment.

As shown in FIG. 7, a third treatment T3 for heat-treating a stacked body SB1 including the silicon carbide member 30 and the first member 10 is carried out in a third atmosphere. The third atmosphere includes nitrogen and oxygen. By the third treatment T3, the nitrogen on the surface of the second film 12*f* and the silicon included in the first member 10 are bonded. As a result, the second layer 12 is formed. A good interface is formed.

The third atmosphere includes, for example, at least one selected from the group consisting of NO and $N_2O$. The third treatment T3 may be performed by, for example, a heat diffusion chamber. The temperature of the third treatment T3 is, for example, not lower than 1100° C. and not higher than 1300° C. The time of the third treatment T3 is, for example, not less than 1 minute and not more than 1 hour.

As described above, the oxygen on the surface of the second film 12*f* is replaced with nitrogen by the second treatment T2. As a result, in the third treatment T3, the nitrogen on the surface of the second film 12*f* and the silicon contained in the first member 10 are bonded. On the other hand, a second reference example in which the second treatment T2 is not performed can be considered. In the second reference example, oxygen is present on the surface of the second film 12*f*. In the second reference example, in the third treatment T3, this oxygen does not bind to the silicon included in the first member 10. Therefore, unbonded hands remain. The unbonded hands form the interfacial level. In the second reference example, it is difficult to obtain the desired characteristics.

FIG. 8 is a schematic cross-sectional view illustrating the method for manufacturing the semiconductor device according to the second embodiment.

FIG. 8 corresponds to another example of the process illustrated in FIG. 4. As shown in FIG. 8, the first layer 11 includes a bond between silicon and nitrogen. It is not necessary to substantially provide the bond between silicon and carbon in at least a part of the first layer 11. In this case as well, a good interface is formed by the second layer 12 provided on the first layer 11.

In the embodiment, information on the composition of elements in the silicon carbide member, member and layer can be obtained from an electron microscope image or the like. The electron microscope image may include, for example, STEM-EDS (Scanning transmission electron microscopy-Energy dispersive spectroscopy) element mapping. The electron microscope image may include, for example, a HAADF (High-Angle Annular Dark Field) STEM image.

The embodiment may include the following configuration (for example, a technical proposal).

(Configuration 1)

A semiconductor device, comprising:

a silicon carbide member including the first region;

a first member including silicon and oxygen;

a first layer provided between the first region and the first member, the first layer including a bond between silicon and nitrogen; and a second layer provided between the first layer and the first member, the second layer including a bond between silicon and oxygen and a bond between silicon and nitrogen.

(Configuration 2)

The semiconductor device according to Configuration 1, wherein a first thickness of the first layer in a first direction from the first region to the first member is 0.5 nm or less.

(Configuration 3)

The semiconductor device according to Configuration 2, wherein the first thickness is 0.3 nm or less.

(Configuration 4)

The semiconductor device according to Configuration 2 or 3, wherein a second thickness of the second layer in the first direction is 1 nm or less.

(Configuration 5)

The semiconductor device according to Configuration 4, wherein the second thickness is 0.7 nm or less.

(Configuration 6)

The semiconductor device according to any one of Configurations 1 to 5, wherein the first layer is a diatomic layer including the bond between silicon and nitrogen.

(Configuration 7)

The semiconductor device according to any one of Configurations 1 to 6, wherein the second layer includes a first oxygen bonded to a first silicon, a second silicon bonded to the first oxygen, and a first nitrogen bonded to the second silicon and a third silicon, an orientation from the first silicon to the second silicon includes a component of a first orientation from the first region to the first member, and an orientation from the second silicon to the third silicon includes a component of the first orientation.

(Configuration 8)

The semiconductor device according to Configuration 1, wherein a first thickness of the first layer in a first direction from the first region to the first member is ½ or less of a second thickness of a second layer in the first direction.

(Configuration 9)

The semiconductor device according to any one of Configurations 1 to 8, wherein the first region does not include nitrogen or a concentration of nitrogen included in the first region is less than $1/10^5$ of a concentration of nitrogen included in the first layer (Configuration 10)

The semiconductor device according to Configuration 9, wherein the concentration of nitrogen included in the first region is $5\times10^{16}$ $cm^{-3}$ or less.

(Configuration 11)

The semiconductor device according to any one of Configurations 1 to 10, wherein the first member does not include nitrogen or a concentration of nitrogen included in the first member is less than 1/10 2 of a concentration of nitrogen included in the first layer.

(Configuration 12)

The semiconductor device according to Configuration 11, wherein the concentration of nitrogen included in the first member is $5\times10^{19}$ $cm^{-3}$ or less.

(Configuration 13)

The semiconductor device according to any one of Configurations 1 to 12, further comprising: a first conductive member, the first member being provided between the first region and the first conductive member.

(Configuration 14)

The semiconductor device according to any one of Configurations 1 to 8, further comprising: a first conductive member, a second conductive member and a third conductive member, the first member being provided between the first region and the first conductive member, the silicon carbide member further including a second region and a third region, the first region being of the first conductive type, the second region being of the second conductive type, the third region being of the first conductive type, at least a part of the second region being between the first region and the third region, the second conductive member being electrically connected to the third region, and the third conductive member being electrically connected to the first region.

(Configuration 15)

A method for manufacturing a semiconductor device, comprising:

performing a first treatment of heat-treating a silicon carbide member in a first atmosphere;

after the first treatment, performing a second treatment of heat-treating the silicon carbide member in a second atmosphere including nitrogen and oxygen;

forming a first member including silicon and oxygen on the silicon carbide member after the second treatment; and performing a third treatment of heat-treating a stacked body including the silicon carbide member and the first member in a third atmosphere including nitrogen and oxygen.

(Configuration 16)

The method for manufacturing a semiconductor device according to Configuration 15, wherein the second atmosphere includes at least one selected from the group consisting of NO and $N_2O$.

(Configuration 17)

The method for manufacturing a semiconductor device according to Configuration 15 or 16, wherein the third atmosphere includes at least one selected from the group consisting of NO and $N_2O$.

(Configuration 18)

The method for manufacturing a semiconductor device according to any one of Configurations 15 to 17, wherein the first atmosphere includes nitrogen, and a concentration of oxygen in the first atmosphere is 1000 ppm or less.

(Configuration 19)

The method for manufacturing a semiconductor device according to any one of Configurations 15 to 18, wherein a first conductive member is further formed on the first member after the third treatment.

(Configuration 20)

The method for manufacturing a semiconductor device according to any one of Configurations 15 to 19, wherein the stacked body includes a first layer provided between the silicon carbide member and the first member, the first layer including a bond between silicon and nitrogen, and a second layer provided between the first layer and the first member, the second layer including a bond between silicon and oxygen and a bond between silicon and nitrogen.

According to the embodiment, it is possible to provide a semiconductor device capable of obtaining good characteristics and a method for manufacturing the same the semiconductor device.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, conductive members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a silicon carbide member including a first region;

a first member including silicon and oxygen;

a first layer provided between the first region and the first member, the first layer including a bond between silicon and nitrogen; and a second layer provided between the first layer and the first member, the second layer including a bond between silicon and oxygen and a bond between silicon and nitrogen, wherein a first silicon located at a first boundary between the first layer and the second layer is bonded with a nitrogen included in the first layer and with a carbon included in the first layer, the first silicon is bonded with a first oxygen included in the second layer, the first oxygen is bonded with a second silicon included in the second layer, the second silicon is bonded with a first nitrogen included in the second layer, the first nitrogen is bonded with a third silicon located at a second boundary between the second layer and the first member, the third silicon is bonded with an oxygen included in the first member, the nitrogen included in the first layer is bonded with a silicon located at a third boundary between the silicon carbide member and the first layer, and the carbon included in the first layer is bonded with another silicon located at the third boundary.

2. The device according to claim 1, wherein a first thickness of the first layer in a first direction from the first region to the first member is 0.5 nm or less.

3. The device according to claim 2, wherein the first thickness is 0.3 nm or less.

4. The device according to claim 2, wherein a second thickness of the second layer in the first direction is 1 nm or less.

5. The device according to claim 4, wherein the second thickness is 0.7 nm or less.

6. The device according to claim 1, wherein the first layer is a diatomic layer including the bond between silicon and nitrogen.

7. The device according to claim 1, wherein an orientation from the first silicon to the second silicon includes a component of a first orientation from the first region to the first member, and an orientation from the second silicon to the third silicon includes a component of the first orientation.

8. The s device according to claim 1, wherein a first thickness of the first layer in a first direction from the first region to the first member is ½ or less of a second thickness of a second layer in the first direction.

9. The device according to claim 1, wherein the first region does not include nitrogen or a concentration of nitrogen included in the first region is less than $1/10^5$ of a concentration of nitrogen included in the first layer.

10. The device according to claim 9, wherein the concentration of nitrogen included in the first region is $5\times10^{16}$ $cm^{-3}$ or less.

11. The semiconductor device according to claim 1, wherein the first member does not include nitrogen or a concentration of nitrogen included in the first member is less than $1/10^2$ of a concentration of nitrogen included in the first layer.

12. The device according to claim 11, wherein the concentration of nitrogen included in the first member is $5\times10^{19}$ $cm^{-3}$ or less.

13. The device according to claim 1, further comprising: a first conductive member, the first member being provided between the first region and the first conductive member.

14. The device according to claim 1, further comprising: a first conductive member, a second conductive member and a third conductive member, the first member being provided between the first region and the first conductive member, the silicon carbide member further including a second region and a third region, the first region being of the first conductive type, the second region being of the second conductive type, the third region being of the first conductive type, at least a part of the second region being between the first region and the third region, the second conductive member being electrically connected to the third region, and the third conductive member being electrically connected to the first region.

* * * * *